United States Patent
Kim et al.

(10) Patent No.: US 11,887,901 B2
(45) Date of Patent: Jan. 30, 2024

(54) SEMICONDUCTOR DEVICE AND TEST APPARATUS AND METHOD THEREOF

(71) Applicant: SILICON WORKS CO., LTD., Daejeon (KR)

(72) Inventors: Jae Won Kim, Daejeon (KR); Yong Jun Ban, Daejeon (KR); Wan Tae Kim, Daejeon (KR); Jin A Kim, Daejeon (KR); Soo Chul Jeon, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 17/472,994

(22) Filed: Sep. 13, 2021

(65) Prior Publication Data

US 2022/0093477 A1 Mar. 24, 2022

(30) Foreign Application Priority Data

Sep. 23, 2020 (KR) ........................ 10-2020-0122669

(51) Int. Cl.
*H01L 21/66* (2006.01)
*G01R 31/28* (2006.01)
*H01L 23/522* (2006.01)

(52) U.S. Cl.
CPC .......... *H01L 22/34* (2013.01); *G01R 31/2886* (2013.01); *H01L 23/5228* (2013.01)

(58) Field of Classification Search
CPC ..... H01L 22/34; H01L 23/5228; H01L 22/12; H01L 22/14; H01L 22/32; H01L 22/20; H01L 21/78; G01R 31/2886; G01R 31/2884

USPC ............. 324/765.05, 762.01, 762.05, 764.01
See application file for complete search history.

(56) References Cited

U.S. PATENT DOCUMENTS

| | | | | |
|---|---|---|---|---|
| 5,777,486 A | * | 7/1998 | Hsu ..................... | G01R 31/2831 324/762.01 |
| 2006/0238217 A1 | * | 10/2006 | Williams ............ | H01L 23/5228 326/9 |
| 2007/0257353 A1 | * | 11/2007 | Park .................... | G01R 31/2884 324/762.01 |

(Continued)

FOREIGN PATENT DOCUMENTS

JP   H05-95039 A    4/1993
KR   10-0750192 B1  8/2007

*Primary Examiner* — Tung X Nguyen
*Assistant Examiner* — Robert P Alejnikov, Jr.
(74) *Attorney, Agent, or Firm* — ROTHWELL, FIGG, ERNST & MANBECK, P.C.

(57) ABSTRACT

The present disclosure relates to a semiconductor device, and a test apparatus and method thereof, capable of accurately detecting a defect by using a plurality of resistor circuits in a test process. The test apparatus of a semiconductor device according to an aspect of the present disclosure may include semiconductor chips each including an external resistor circuit disposed to be dispersed along an outer region of a chip and an internal resistor circuit disposed in an inner region of the chip in order to test cracks, and test equipment that drives the external resistor circuit and the internal resistor circuit and compares an output of the external resistor circuit with an output of the internal resistor circuit to detect whether a defect occurs in each of the semiconductor chips.

17 Claims, 12 Drawing Sheets

(56) References Cited

U.S. PATENT DOCUMENTS

2019/0227586 A1\* 7/2019 Shafeeu ................ G05F 1/461
2019/0348333 A1\* 11/2019 Sander ............. H01L 23/49562

\* cited by examiner

SEMICONDUCTOR DEVICE AND TEST APPARATUS AND METHOD THEREOF

CROSS-REFERENCE TO RELATED APPLICATIONS

This application claims the benefit of the Korean Patent Applications No. 10-2020-0122669 filed on Sep. 23, 2020, which are hereby incorporated by reference as if fully set forth herein.

FIELD

The present disclosure relates to a semiconductor device, and a test apparatus and method thereof, capable of electrically detecting a defect in a test process.

BACKGROUND

Semiconductor chips are formed by performing a plurality of unit processes on a silicon wafer. The semiconductor chips formed in each semiconductor chip region on the silicon wafer are spaced at predetermined intervals from each other with scribe lanes interposed therebetween.

When a semiconductor chip manufacturing process is completed, in order to individually package the semiconductor chips, a dicing process is performed in which the wafer is cut along a center line of the scribe lane to separate the semiconductor chips from each other.

However, in the dicing process of cutting the silicon wafer or a handling process, cracks may be generated at a cut surface and a periphery of the semiconductor chip by external physical force, and thus crack defects spreading to the semiconductor chip region may occur.

Since crack defects in the semiconductor chip cause malfunctions and reliability failures of the semiconductor chip, there is a need for a method of accurately detecting various chip defects including the crack defects in the semiconductor chip in a test process.

SUMMARY

The present disclosure is directed to providing a semiconductor device, and a crack test apparatus and method thereof, capable of accurately detecting a defect by using a plurality of resistor circuits in a test process.

A semiconductor device according to an aspect of the present disclosure includes an external resistor circuit disposed to be dispersed along an outer region of a chip, wherein the external resistor circuit may include an external resistor structure including at least one of a diffusion layer, a polysilicon layer, and a wiring layer, an external transistor connected to the external resistor structure, and a first test pad disposed in a chip pad region and connected to the external transistor through the external resistor structure. The external resistor circuit may output a current of the external transistor to the first test pad based on a change in a resistance value of the external resistor structure.

A semiconductor device according to an aspect of the present disclosure further includes an internal resistor circuit disposed in an inner region of the chip. The internal resistor circuit may include an internal resistor structure disposed in the inner region of the chip and including at least one of a diffusion layer, a polysilicon layer, and a wiring layer, an internal transistor connected to the internal resistor structure, and a second test pad disposed in the chip pad region and connected to the internal transistor through the internal resistor structure.

A test apparatus of a semiconductor device according to an aspect of the present disclosure includes semiconductor chips each including an external resistor circuit disposed to be dispersed along an outer region of a chip and an internal resistor circuit disposed in an inner region of the chip, and test equipment that drives the external resistor circuit and the internal resistor circuit and compares an output of the external resistor circuit with an output of the internal resistor circuit to detect whether a defect occurs in each of the semiconductor chips.

A test apparatus of a semiconductor device according to an aspect of the present disclosure includes semiconductor chips each including a plurality of external resistor circuits disposed to be dispersed along an outer region of a chip, and test equipment that drives the plurality of external resistor circuits, and compares outputs of the plurality of external resistor circuits with each other or compares the outputs with a predetermined reference value to detect whether a defect has occurred in each semiconductor chip.

A test method of a semiconductor device according to an aspect of the present disclosure includes separating a plurality of semiconductor chips including an external resistor circuit disposed to be dispersed along an outer region of a chip and an internal resistor circuit disposed in an inner region of the chip by a dicing process, driving the external resistor circuit and the internal resistor circuit of each of the semiconductor chips, and comparing an output of the external resistor circuit with an output of the internal resistor circuit, and determining that a defect has occurred in the detected semiconductor chip when an output out of an allowable range compared to the output of the internal resistor circuit among the outputs of the external resistor circuit is detected.

A test method of a semiconductor device according to an aspect of the present disclosure includes separating a plurality of semiconductor chips including a plurality of external resistor circuits disposed to be dispersed along an outer region of a chip by a dicing process, driving the plurality of external resistor circuits of each of the semiconductor chips, and comparing outputs of the plurality of external resistor circuits with each other or comparing the outputs with a predetermined reference value, and determining that a defect has occurred in the detected semiconductor chip when an output out of an allowable range compared to the reference value or another output among the outputs of the plurality of external resistor circuits is detected.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1A:
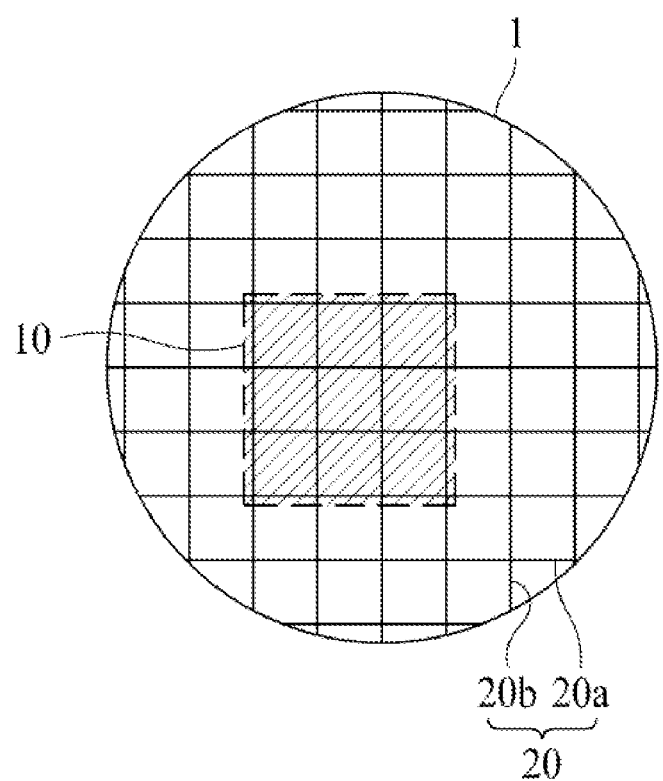
FIGS. 1A and 1B are views showing a semiconductor wafer on which semiconductor chips according to one embodiment are disposed.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element or layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present specification will be described in detail with reference to the accompanying drawings.

Figure 1B:
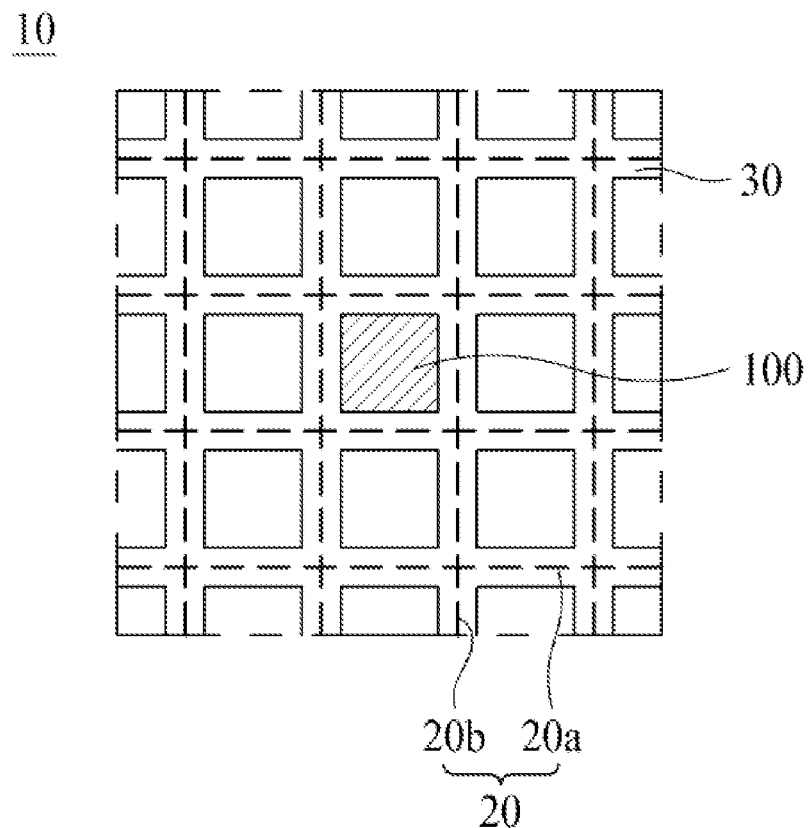

FIG. 1A is a plan view showing a semiconductor wafer 1 on which semiconductor chips according to one embodiment are formed, and FIG. 1B is an enlarged plan view of a partial region 10 of the semiconductor wafer 1 illustrated in FIG. 1A.

Referring to FIGS. 1A and 1B, semiconductor chips 100 formed through a semiconductor manufacturing process are arranged in a matrix form on the semiconductor wafer 1. Each of the semiconductor chips 100 is formed in each semiconductor chip region on the semiconductor wafer 1 and is spaced apart from each other at equivalent intervals with scribe lanes 30 interposed therebetween that extend in a lateral direction and a longitudinal direction to be orthogonal and have a predetermined width.

Each semiconductor chip 100 has a circuit part therein, and a plurality of pads connected to an internal circuit are disposed in an outer region of each semiconductor chip 100 in an exposed structure for electrical connection with an external circuit.

When the semiconductor chips 100 are completed on the semiconductor wafer 1 through the manufacturing process, a dicing process of cutting the semiconductor wafer 1 along center lines 20 of the scribe lanes 30, that is, center lines 20a in the lateral direction and center lines 20b in the longitudinal direction is performed to separate the semiconductor chips 100 from each other.

In a test process after dicing, a test equipment detects a change in resistance due to various defects including chip cracks by using a plurality of resistor circuits disposed to be dispersed in the outer region of the semiconductor chip 100 according to one embodiment, and accordingly, it is possible to electrically and accurately detect whether a defect has occurred and a defect occurrence position.

Figure 2:
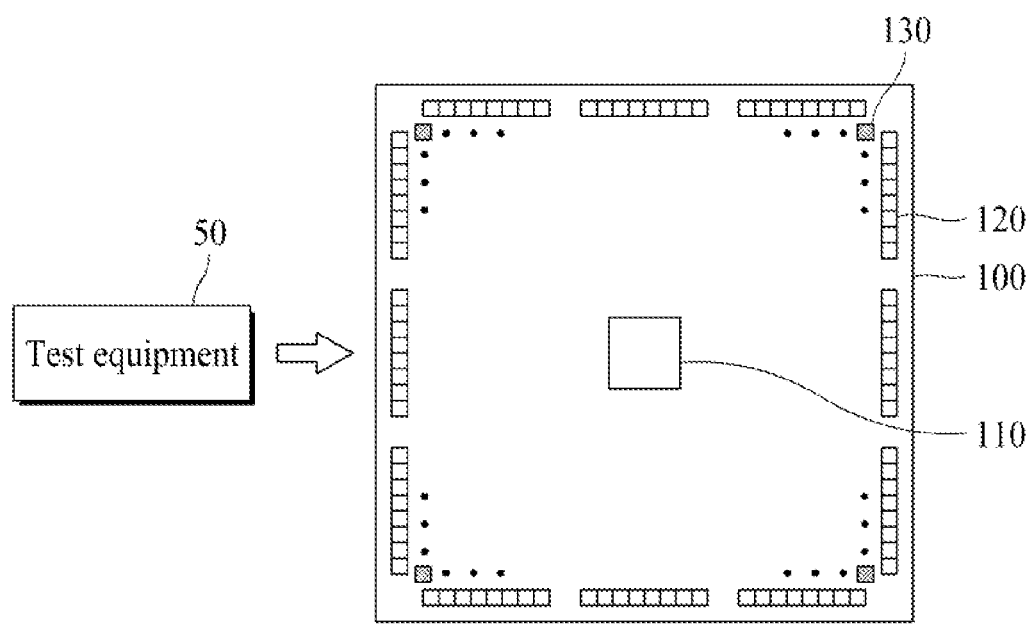
FIG. 2 is a schematic diagram showing a semiconductor chip having external and internal resistor circuits and test equipment thereof according to one embodiment.
Figure 3:
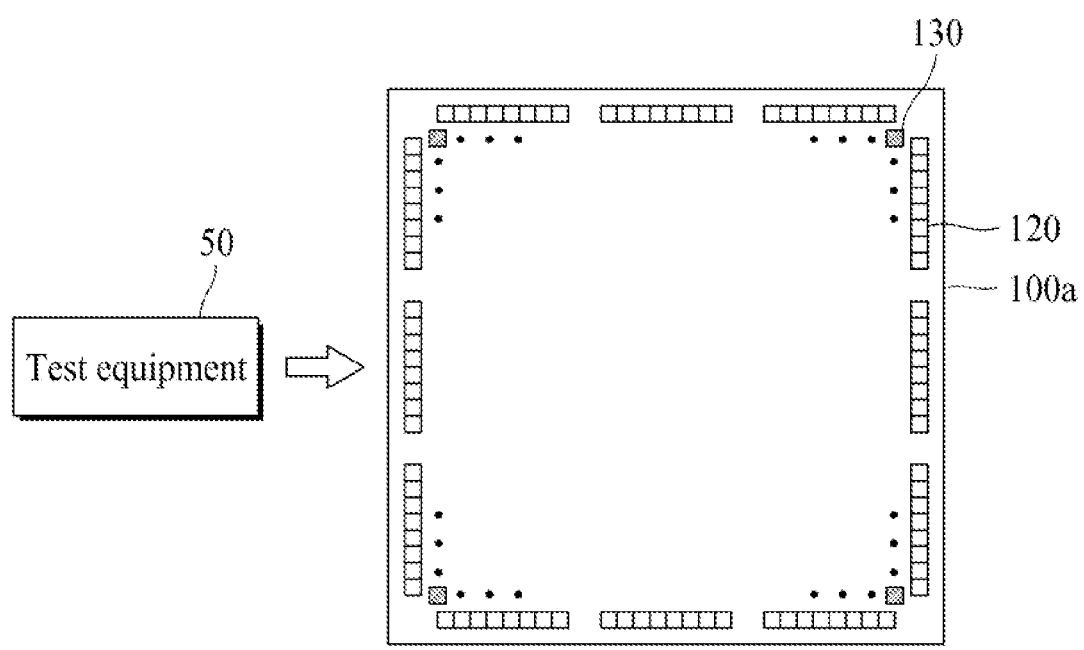
FIG. 3 is a schematic diagram showing a semiconductor chip having an external resistor circuit and test equipment thereof according to one embodiment.

FIG. 2 is a schematic diagram showing a semiconductor chip having external and internal resistor circuits and test equipment thereof according to one embodiment, and FIG. 3 is a schematic diagram showing a semiconductor chip having an external resistor circuit and test equipment thereof according to one embodiment.

Referring to FIG. 2, a semiconductor chip 100 according to one embodiment may include a plurality of external resistor circuits 120 disposed to be dispersed along an outer region of the chip and an internal resistor circuit 110 disposed in an inner region of the chip for a defect test. Since the internal resistor circuit 110 is to provide a reference to the external resistor circuits 120 during a defect test, it may be defined as a reference resistor circuit. Each of the external resistor circuits 120 and the internal resistor circuit 110 may have equal or similar resistance values.

The plurality of external resistor circuits 120 may be disposed to be dispersed along the outer region of the chip surrounding a pad region in which pads 130 connected to the internal circuit are positioned in the semiconductor chip 100. In other words, the external resistor circuits 120 of each semiconductor chip 100 on the semiconductor wafer 1 (see FIG. 1A) may be disposed between the pad region of each semiconductor chip 100 and the scribe lanes 30 (see FIG. 1B).

For example, twelve external resistor circuits 120 may be disposed in a structure separated from each other in four outer regions of the rectangular semiconductor chip 100.

Each of the external resistor circuits 120 independently disposed inside the outer region of the chip may be connected to one pad (a first test pad) of the pads 130 positioned in the pad region. The internal resistor circuit 110 may be connected to another pad (a second test pad) among the pads 130 positioned in the pad region.

In a test process after dicing, a test equipment 50 may measure and compare outputs of the external resistor circuits 120 of the semiconductor chip 100 shown in FIG. 2 and a reference output of the internal resistor circuit 110 to detect whether a chip defect has occurred and a defect occurrence position. When an external resistor circuit 120 having an abnormal output out of an allowable range compared to the reference output of the internal resistor circuit 110 is detected, the test equipment 50 may determine that a chip defect has occurred and may detect a position in which the corresponding external resistor circuit 120 is disposed as a defect occurrence position.

Meanwhile, a semiconductor chip 100a according to one embodiment may include a plurality of external resistor circuits 120 disposed to be dispersed along the outer region of the chip for a test as shown in FIG. 3, and the internal resistor circuit 110 shown in FIG. 2 may be omitted.

In the test process after dicing, the test equipment 50 may compare outputs of the external resistor circuits 120 of the semiconductor chip 100a shown in FIG. 3 to detect whether a defect has occurred and a defect occurrence position. When an external resistor circuit 120 having an abnormal output out of an allowable range compared to another output among the outputs of the external resistor circuits 120 is detected, the test equipment 50 may determine that a defect has occurred and may detect a position in which the corresponding external resistor circuit 120 is disposed as a defect occurrence position.

Alternatively, the test equipment 50 may compare the output of each of the external resistor circuits 120 of the semiconductor chip 100a shown in FIG. 3 with a reference value to detect whether a defect has occurred and a defect occurrence position. The reference value may be a simulation value determined during a chip design process or output values measured from the external resistor circuits 120 that are not damaged before dicing. When an external resistor circuit 120 having an abnormal output out of an allowable range compared to the reference value among the outputs of the external resistor circuit 120 is detected, the test equipment 50 may determine that a chip defect has occurred and may detect a position in which the corresponding external resistor circuit 120 is disposed as a defect occurrence position.

Figure 4:
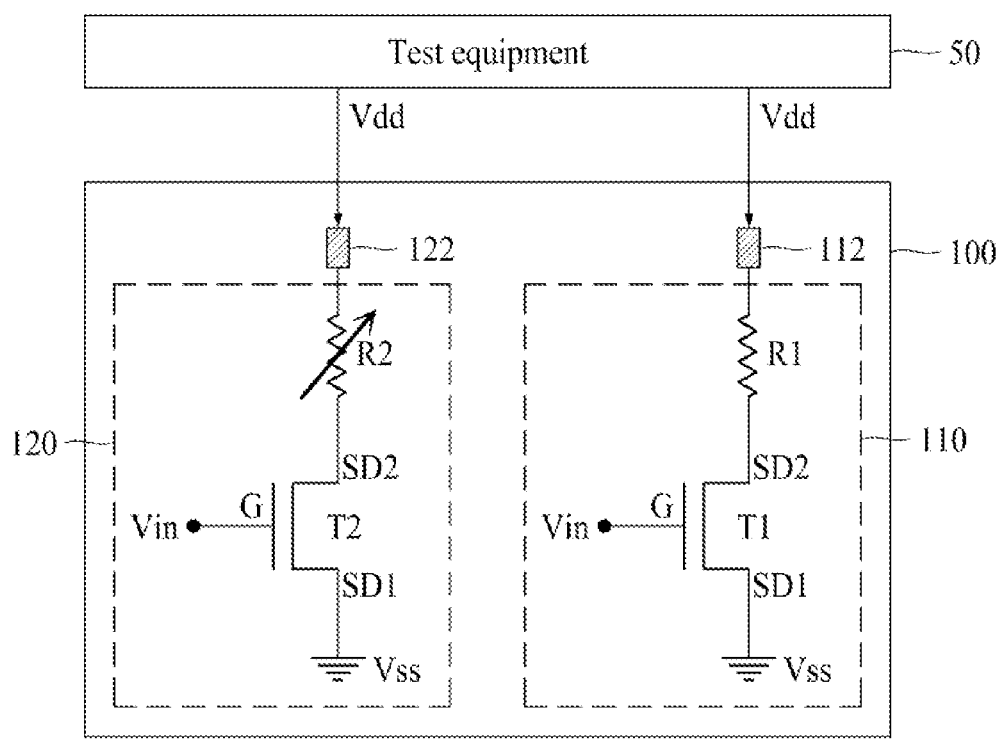
FIG. 4 is an equivalent circuit diagram showing a test apparatus of a semiconductor chip according to one embodiment.

FIG. 4 is an equivalent circuit diagram showing a test apparatus of a semiconductor chip according to one embodiment.

Referring to FIG. 4, each external resistor circuit 120 embedded in the semiconductor chip 100 may include an external resistor structure R2 including at least one of a semiconductor diffusion layer, a polysilicon layer, and a metal layer disposed inside an outer region of the chip, and an external transistor T2 connected to a first test pad 122 via the external resistor structure R2. The external resistor structures R2 of the external resistor circuits 120 may be formed to have the same or similar resistance values, and the external transistors T2 may be formed to have the same or similar performance.

A gate electrode G of the external transistor T2 receives a control signal Vin of high-potential power of an internal circuit of the semiconductor chip 100, a first source/drain electrode SD1 is connected to a low-potential power Vss of the internal circuit, and a second source/drain electrode SD2 is connected to the first test pad 122 via the external resistor structure R2. The first test pad 122 receives a high-potential power Vdd from the test equipment 50 and supplies the high-potential power Vdd to the external transistor T2 via the external resistor structure R2, and the test equipment 50 is used as a terminal for measuring the output of the external resistor circuit 120 that is proportional to the performance of the external transistor T2.

The internal resistor circuit 110 embedded in the semiconductor chip 100 may be positioned inside the pad region in the semiconductor chip 100 and disposed in an inner region that is not subject to crack damage. The internal resistor circuit 110 may include an internal resistor structure R1 including at least one of a semiconductor diffusion layer, a polysilicon layer, and a metal layer and an internal transistor T1 connected to a second test pad 112 via the internal resistor structure R1. The internal resistor structure R1 of the internal resistor circuit 110 may be formed to have a resistance value the same as or similar to that of the external resistor structure R2 of the external resistor circuit 120, and the internal transistor T1 may be formed to have performance the same as or similar to that of the external transistor T2.

A gate electrode G of the internal transistor T1 receives the control signal Vin of the high-potential power of the internal circuit of the semiconductor chip 100, and a first source/drain electrode SD1 is connected to the low-potential power Vss of the internal circuit, and a second source/drain electrode SD2 is connected to the second test pad 112 via the internal resistor structure R1. The second test pad 112 receives the high-potential power Vdd from the test equipment 50 and supplies the high-potential power Vdd to the internal transistor T1 via the internal resistor structure R1, and the test equipment 50 is used as a terminal for measuring the output of the internal resistor circuit 110 that is proportional to the performance of the internal transistor T1.

In the test process after dicing, the test equipment 50 applies power to the semiconductor chip 100 to apply the control signal Vin of a gate-on voltage and the low-potential power Vss to the internal transistor T1 and the external transistor T2 and applies the high-potential power Vdd to the first test pad 122 and the second test pad 112 to turn on the internal transistor T1 and the external transistor T2. The test equipment 50 measures the output of each external resistor circuit 120 via the first test pad 122 and measures the output of the internal resistor circuit 110 via the second test pad 112. The test equipment 50 may compare the output of each of the external resistor circuits 120 with the output of the internal resistor circuit 110 to detect whether a defect has occurred and a defect occurrence position.

For example, when a crack defect occurs in the external resistor structure R2 including at least one of the semiconductor diffusion layer, the polysilicon layer, and the metal layer disposed in the outer region of the semiconductor chip 100 due to an external physical force, a resistance value of the corresponding external resistor structure R2 increases during the test process and a voltage drop amount of the high-potential power Vdd increases, and thus an amount of current flowing through the external transistor T2 decreases, thereby deteriorating the performance of the external transistor T2. As a result, an output signal (current amount) of the external resistor circuit 120 measured through the first test pad 122 decreases.

The test equipment 50 compares the output signal of the external resistor circuit 120 with an output signal of the internal resistor circuit 110, and when an external resistor circuit 120 having an abnormal output equal to or less than an allowable range compared to the output signal of the internal resistor circuit 110 is detected, it is determined that a defect has occurred, and a position where the corresponding external resistor circuit 120 is disposed may be detected as a defect occurrence position.

Meanwhile, when only the external resistor circuits 120 are provided without an internal resistor circuit like the semiconductor chip 100a shown in FIG. 3, the test equipment 50 compares the outputs of the external resistor circuits 120 with each other, and when an external resistor circuit 120 having an abnormal output that is equal to or less than the allowable range compared to other outputs is detected, the test equipment 50 may determine that a defect has occurred and may detect a position in which the corresponding external resistor circuit 120 is disposed as a defect occurrence position.

Alternatively, the test equipment 50 compares the output of each of the external resistor circuits 120 with the reference value, and when an external resistor circuit 120 having an abnormal output that is equal to or less than the allowable range compared to the reference value is detected, the test equipment 50 may determine that a defect has occurred and may detect a position in which the corresponding external resistor circuit 120 is disposed as a defect occurrence position.

Since the semiconductor chip 100 in which the defect is detected is determined as a defective chip and discarded, it is possible to prevent quality accidents.

FIGS. 5 to 12 are cross-sectional views showing various external resistor circuit structures of a semiconductor chip according to one embodiment.

Figure 5:
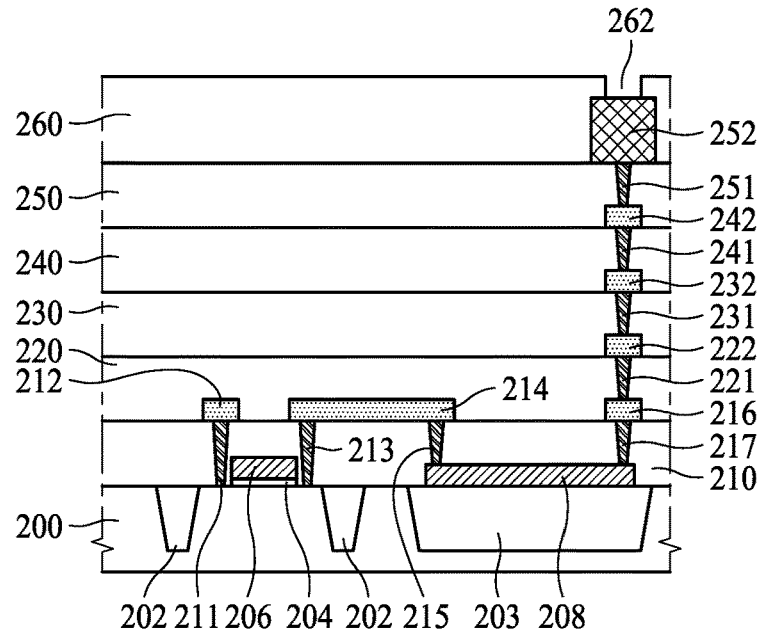
FIG. 5 is a cross-sectional view showing a structure of an external resistor circuit of a semiconductor chip according to one embodiment.

Referring to FIG. 5, the external resistor circuit of the semiconductor chip according to one embodiment may include a transistor that includes a gate insulating film 204, a gate electrode 206, a source electrode 212, and a drain electrode 214 disposed on a semiconductor substrate 200 and a resistor structure that includes an impurity diffusion layer, a polysilicon layer 208, and a plurality of metal wiring layers 216, 222, 232, 242, and 252 connected to the transistor.

In the semiconductor substrate 200, each element region is electrically separated by an insulating structure 202. The gate electrode 206 overlaps a channel region of the corresponding element region of the semiconductor substrate 200 with the gate insulating film 204 interposed therebetween. The source electrode 212 and the drain electrode 214 on an interlayer insulating film 210 are each connected to a diffusion layer doped with impurities of the corresponding element region of the semiconductor substrate 200 via contact plugs 211 and 213 formed in contact holes of the interlayer insulating film 210.

The polysilicon layer 208 among the resistor structure is disposed on an insulating structure 203 of the semiconductor substrate 200, is connected to the drain electrode 214 via one contact plug 215 formed in the interlayer insulating film 210, and is connected to the lowermost metal wiring layer 216 on the interlayer insulating film 210 via another contact plug 217.

The plurality of metal wiring layers 216, 222, 232, 242, and 252 among the resistor structures may be respectively disposed on a plurality of interlayer insulating films 210, 220, 230, 240 and 250 and may be connected to vertically adjacent wiring layers via contact plugs 221, 231, 241, and 251 respectively formed in contact holes of the plurality of interlayer insulating films 220, 230, 240, and 250. The plurality of metal wiring layers 216, 222, 232, 242, and 252 may overlap each other and may be disposed to overlap at least a part of the polysilicon layer 208. The uppermost metal wiring layer 252 may be exposed through a pad hole 262 passing through a passivation layer 260 to be used as a test pad.

Figure 6:
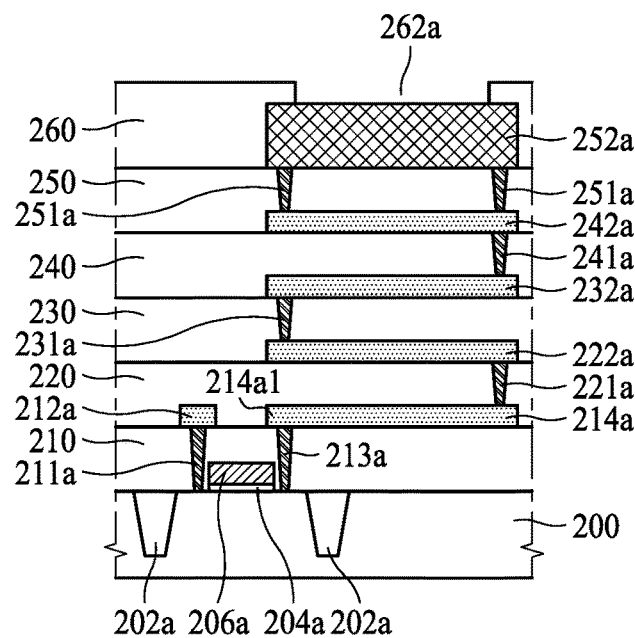
FIG. 6 is a cross-sectional view showing a structure of an external resistor circuit of a semiconductor chip according to one embodiment.

Referring to FIG. 6, the external resistor circuit of the semiconductor chip according to one embodiment may include a transistor that includes a gate insulating film 204a, a gate electrode 206a, a source electrode 212a, and a drain electrode 214a1 disposed on a semiconductor substrate 200 and a resistor structure that includes a diffusion layer and a plurality of metal wiring layers 214a, 222a, 232a, 242a, and 252a connected to the transistor.

The gate electrode 206a is disposed on a channel region of the corresponding element region separated by an insulating structure 202a of the semiconductor substrate 200 with the gate insulating film 204a interposed therebetween. The source electrode 212a and the drain electrode 214a1 disposed on an interlayer insulating film 210 are each connected to a diffusion layer of the corresponding element region of the semiconductor substrate 200 via contact plugs 211a and 213a formed in contact holes of the interlayer insulating film 210.

The plurality of metal wiring layers 214a, 222a, 232a, 242a, and 252a among the resistor structure are respectively disposed on a plurality of interlayer insulating films 210, 220, 230, 240, and 250 and may be connected to vertically adjacent wiring layers via contact plugs 221a, 231a, 241a, and 251a respectively formed in contact holes of the plurality of interlayer insulating films 220, 230, 240, and 250. The plurality of metal wiring layers 214a, 222a, 232a, 242a, and 252a may overlap each other and may be connected in series via the contact plugs 221a, 231a, 241a, and 251a. The plurality of metal wiring layers 222a, 232a, 242a, and 252a may be disposed to overlap the drain electrode 214a1 of the transistor. The uppermost metal wiring layer 252a may be exposed through a pad hole 262a passing through a passivation layer 260 to be used as a test pad.

Figure 7:
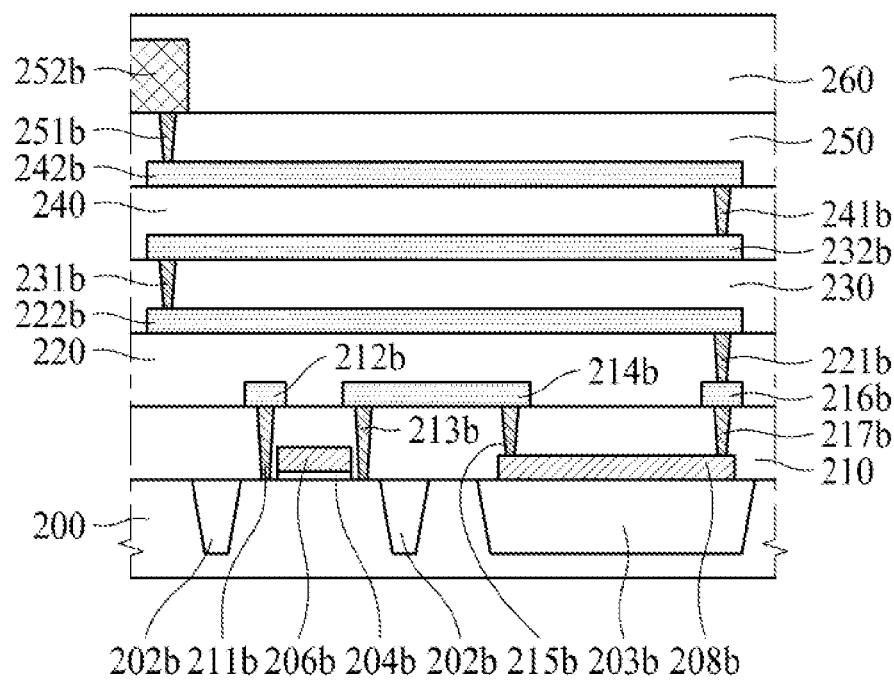
FIG. 7 is a cross-sectional view showing a structure of an external resistor circuit of a semiconductor chip according to one embodiment.

Referring to FIG. 7, the external resistor circuit of the semiconductor chip according to one embodiment may include a transistor that includes a gate insulating film 204b, a gate electrode 206b, a source electrode 212b, and a drain electrode 214b disposed on a semiconductor substrate 200 and a resistor structure that includes a diffusion layer, a polysilicon layer 208b, and a plurality of metal wiring layers 216b, 222b, 232b, 242b, and 252b connected to the transistor.

The gate electrode 206b is disposed on a channel region of the corresponding element region separated by an insulating structure 202b of the semiconductor substrate 200 with the gate insulating film 204b interposed therebetween. The source electrode 212b and the drain electrode 214b disposed on an interlayer insulating film 210 are each connected to a diffusion layer of the corresponding element region of the semiconductor substrate 200 via contact plugs 211b and 213b formed in contact holes of the interlayer insulating film 210.

The polysilicon layer 208b among the resistor structure may be disposed on an insulating structure 203b of the semiconductor substrate 200, may be connected to the drain electrode 214b via one contact plug 215b formed in the interlayer insulating film 210, and may be connected to the lowermost metal wiring layer 216b on the interlayer insulating film 210 via another contact plug 217b.

The plurality of metal wiring layers 216b, 222b, 232b, 242b, and 252b among the resistor structure are respectively disposed on a plurality of interlayer insulating films 210, 220, 230, 240, and 250 and may be connected to vertically adjacent wiring layers via contact plugs 221b, 231b, 241b, and 251b respectively formed in contact holes of the plurality of interlayer insulating films 220, 230, 240, and 250. The plurality of metal wiring layers 222b, 232b, 242b, and 252b may overlap each other and may be connected in series via the contact plugs 231b, 241b, and 251b. The plurality of metal wiring layers 222b, 232b, 242b, and 252b are disposed to overlap the transistor and the polysilicon layer 208b of the corresponding resistor circuit, so that an arrangement area of the resistor structure is increased, thereby increasing a defect detection region. The uppermost metal wiring layer 252b may be exposed through a pad hole 262a passing through a passivation layer 260 to be used as a test pad.

Figure 8:
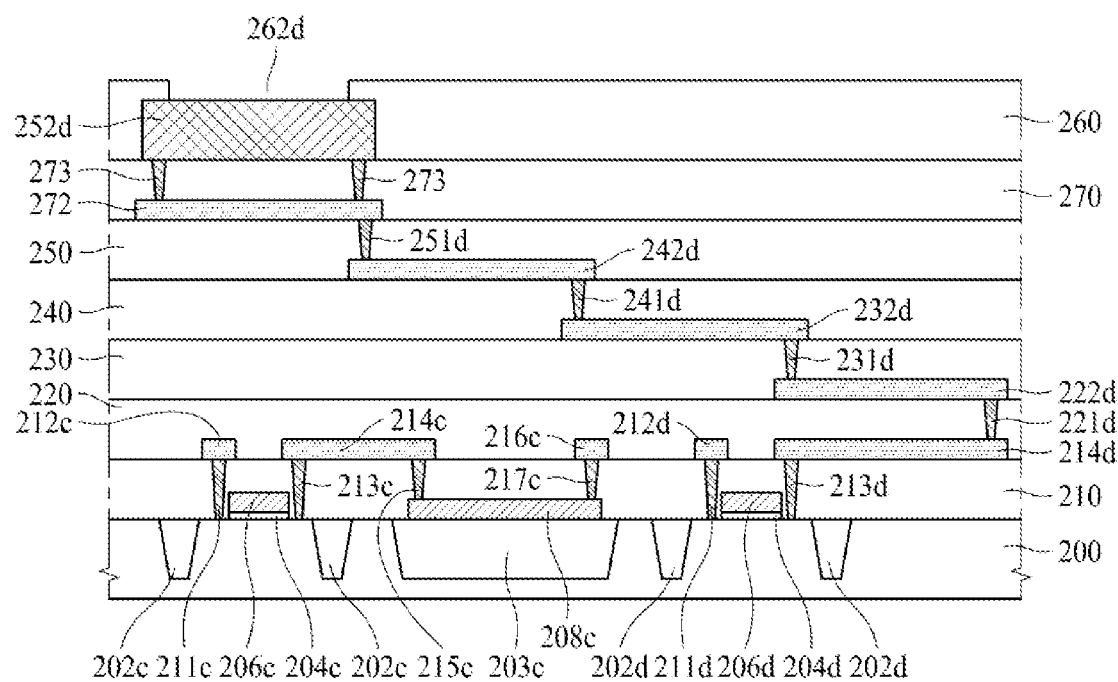
FIG. 8 is a cross-sectional view showing a structure of an external resistor circuit of a semiconductor chip according to one embodiment.

Referring to FIG. 8, the external resistor circuit of the semiconductor chip according to one embodiment may include a transistor that includes a gate insulating film 204d, a gate electrode 206d, a source electrode 212d, and a drain electrode 214d disposed on the semiconductor substrate 200 and a resistor structure that includes a diffusion layer and a plurality of metal wiring layers 222d, 232d, 242d, 272, and 252d connected to the transistor. The resistor structure may be disposed to overlap the transistor of the corresponding resistor circuit and overlap another adjacent resistor circuit.

The gate electrode 206d is disposed on a channel region of the corresponding element region separated by an insulating structure 202d of the semiconductor substrate 200 with the gate insulating film 204d interposed therebetween. The source electrode 212d and the drain electrode 214d disposed on an interlayer insulating film 210 are each connected to the diffusion layer of the corresponding element region of the semiconductor substrate 200 via contact plugs 211d and 213d formed in contact holes of the interlayer insulating film 210.

The plurality of metal wiring layers 222d, 232d, 242d, 272, and 252d among the resistor structure are respectively disposed on a plurality of interlayer insulating films 220, 230, 240, 250, and 270 and may be connected to vertically adjacent wiring layers via contact plugs 221d, 231d, 241d, 251d, and 273 formed in contact holes of the plurality of interlayer insulating films 220, 230, 240, and 250 and 270. The lowermost metal wiring layer 222d among the plurality of metal wiring layers 222d, 232d, 242d, 272, and 252d may overlap the drain electrode 214d connected via the contact plug 221d. The plurality of metal wiring layers 222d, 232d, 242d, and 272 may be connected in series via the contact plugs 231d, 241d, and 251d. Each of the metal wiring layers 222d, 232d, 242d, and 272 may include a first end portion and a second end portion, the first end portion of the corresponding metal wiring layer may be connected via a lower contact plug while overlapping the second end portion of a lower metal wiring layer, and the second end portion of the corresponding metal wiring layer may be connected via an upper contact plug while overlapping the first end portion of an upper metal wiring layer. The uppermost metal wiring layer 252d may be connected in parallel with the lower wiring layer 272 via a plurality of contact plugs 273 and may be exposed through a pad hole 262d passing through a passivation layer 260 to be used as a test pad.

The lowermost wiring layer 222d among the plurality of metal wiring layers 222d, 232d, 242d, 272, and 252d constituting the corresponding resistor structure may be disposed to overlap the drain electrode 214d of the corresponding transistor, and the remaining metal wiring layers 232d, 242d, 272, and 252d may be disposed to overlap another adjacent resistor circuit, thereby further increasing an arrangement area of the corresponding resistor structure and a defect detection region proportional thereto. The metal wiring layers 232d, 242d, 272, and 252d may be disposed to overlap the transistor and a polysilicon layer 208c of another adjacent resistor circuit. The transistor of the other resistor circuit includes a gate insulating film 206c and a gate electrode 204c on the corresponding element region separated by an insulating structure 202c of the semiconductor substrate 200, and a source electrode 212c and a drain electrode 214c on the interlayer insulating film 210. The source electrode 212c and the drain electrode 214c are connected to a diffusion layer of the semiconductor substrate 200 via contact plugs 211c and 213c. The polysilicon layer 208c constituting the resistor structure of the other resistor circuit may be disposed on an insulating structure 203c of the semiconductor substrate 200, may be connected to the drain electrode 214c via a contact plug 215c, and may be connected to a metal wiring layer 216c via another contact plug 217c.

Figure 9:
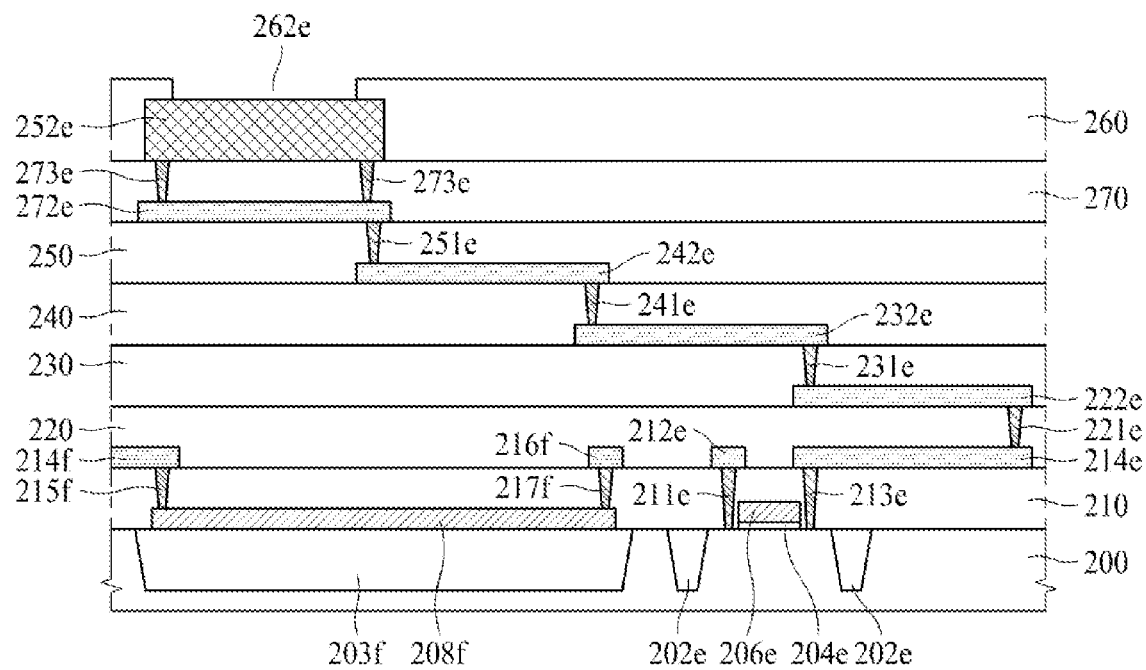
FIG. 9 is a cross-sectional view showing a structure of an external resistor circuit of a semiconductor chip according to one embodiment.

Referring to FIG. 9, the external resistor circuit of the semiconductor chip according to one embodiment may include a transistor that includes a gate insulating film 204e, a gate electrode 206e, a source electrode 212e, and a drain electrode 214e disposed on the semiconductor substrate 200 and a resistor structure that includes a diffusion layer and a plurality of metal wiring layers 222e, 232e, 242e, 272e, and 252e connected to the transistor. The resistor structure may be disposed to overlap the transistor of the corresponding resistor circuit and overlap the resistor structure of another adjacent resistor circuit.

The gate insulating film 204e and the gate electrode 206e are disposed on a channel region of the corresponding element region separated by an insulating structure 202e of the semiconductor substrate 200, and the source electrode 212e and the drain electrode 214e disposed on an interlayer insulating film 210 are respectively connected to a diffusion layer of the corresponding element region of the semiconductor substrate 200 via contact plugs 211e and 213e.

The plurality of metal wiring layers 222e, 232e, 242e, 272e, and 252e among the resistor structure are respectively disposed on a plurality of interlayer insulating films 220, 230, 240, 250, and 270 and may be connected to vertically adjacent wiring layers via contact plugs 221e, 231e, 241e, 251e, and 273e. The lowermost metal wiring layer 222e may overlap the drain electrode 214e connected via the contact plug 221e. The plurality of metal wiring layers 222e, 232e, 242e, and 272e may be connected in series via the contact plugs 231e, 241e, and 251e. Each of the metal wiring layers 222e, 232e, 242e, and 272e may include a first end portion and a second end portion, the first end portion of the corresponding metal wiring layer may be connected via a lower contact plug while overlapping the second end portion of a lower metal wiring layer, and the second end portion of the corresponding metal wiring layer may be connected via an upper contact plug while overlapping the first end portion of an upper metal wiring layer. The uppermost metal wiring layer 252e may be connected in parallel with the lower wiring layer 272e via a plurality of contact plugs 273e and may be exposed through a pad hole 262e passing through a passivation layer 260 to be used as a test pad.

Some of the lower wiring layers 222e and 232e among the plurality of metal wiring layers 222e, 232e, 242e, 272e, and 252e constituting the corresponding resistor structure may be disposed to overlap the corresponding transistor, and the remaining metal wiring layers 242e, 272e, and 252e may be disposed to overlap a polysilicon layer 208f constituting the resistor structure of another adjacent resistor circuit. The polysilicon layer 208f constituting the resistor structure of the other resistor circuit may be disposed on an insulating structure 203f of the semiconductor substrate 200, may be connected to a drain electrode 214f via a contact plug 215f, and may be connected to a metal wiring layer 216f via another contact plug 217f. The polysilicon layer 208f may be formed to be elongated to overlap the plurality of metal wiring layers 242e, 272e, and 252e of the adjacent resistor circuit, thereby further increasing a defect detection region of the polysilicon layer 208f.

The plurality of external resistor circuits may have the same structure or different structures.

Figure 10:
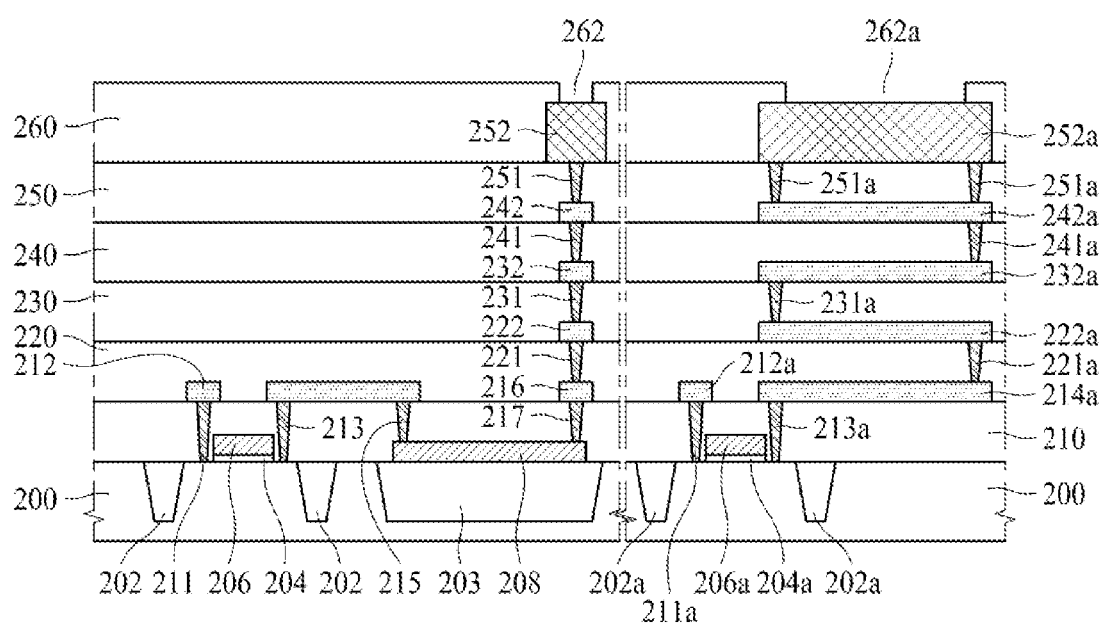
FIG. 10 is a cross-sectional view showing a structure of external resistor circuits of a semiconductor chip according to one embodiment.

Referring to FIG. 10, one of the plurality of external resistor circuits may include a resistor structure composed of a diffusion layer, a polysilicon layer 208, and metal wiring layers 216, 222, 232, 242, and 252, and a transistor connected to the resistor structure like the resistor circuit shown in FIG. 5, and the other one may include a resistor structure composed of a diffusion layer and metal wiring layers 214a, 222a, 232a, 242a, and 252a, like the resistor circuit shown in FIG. 6, and a transistor connected to the resistor structure.

Figure 11:
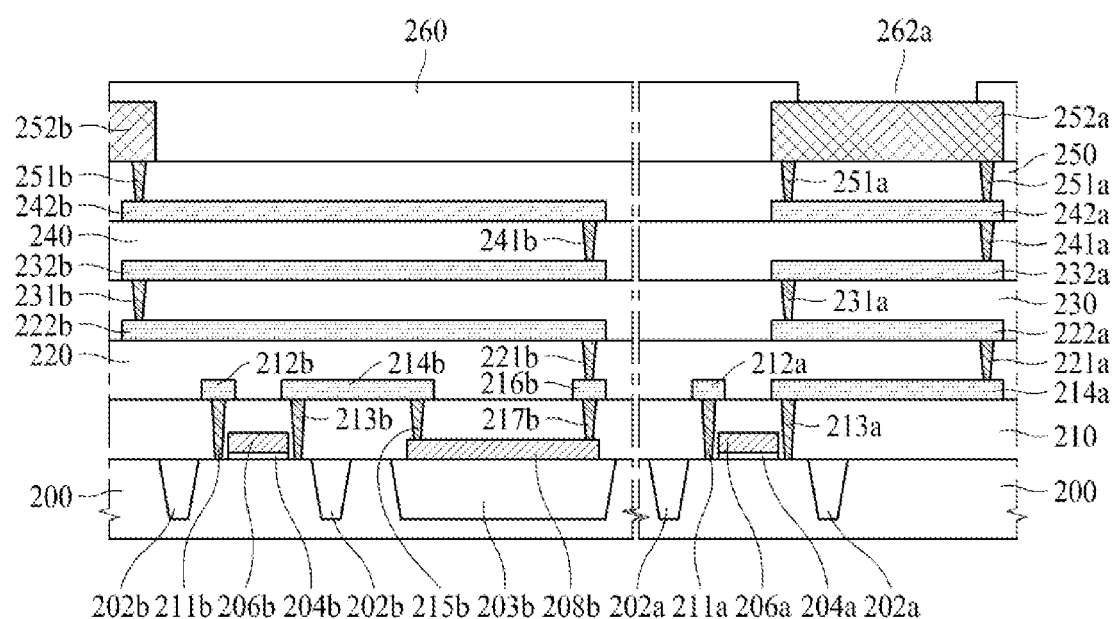
FIG. 11 is a cross-sectional view showing a structure of external resistor circuits of a semiconductor chip according to one embodiment.

Referring to FIG. 11, one of the plurality of external resistor circuits may include a resistor structure composed of a diffusion layer, a polysilicon layer 208, and metal wiring layers 214a, 222a, 232a, 242a, and 252a and a transistor connected to the resistor structure like the resistor circuit shown in FIG. 5, and the other one may include a resistor structure composed of a diffusion layer, a polysilicon layer 208b, and metal wiring layers 216b, 222b, 232b, 242b, and 252b, like the resistor circuit shown in FIG. 7, and a transistor connected to the resistor structure.

Figure 12:
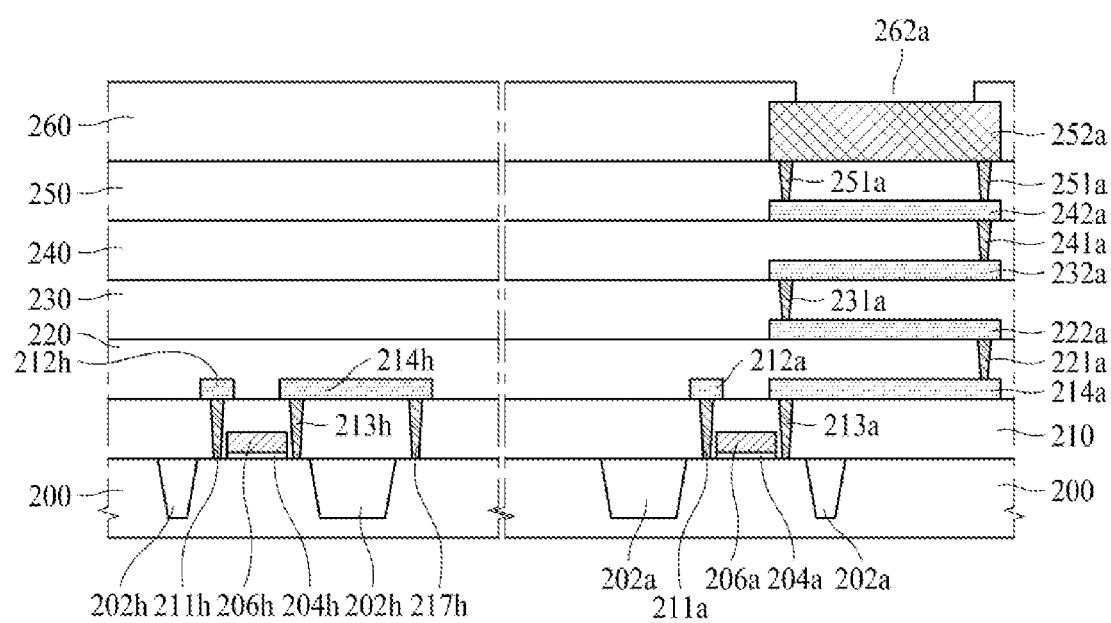
FIG. 12 is a cross-sectional view showing a structure of external resistor circuits of a semiconductor chip according to one embodiment.

Referring to FIG. 12, one of the plurality of external resistor circuits may include a resistor structure composed of a diffusion layer and metal wiring layers 214a, 222a, 232a, 242a, and 252a, and a transistor connected to the resistor structure like the resistor circuit shown in FIG. 6, and the other one may include a resistor structure composed of at least a diffusion layer of the semiconductor substrate 200 and a transistor connected to the resistor structure. In this transistor, a gate insulating film 204h and a gate electrode 206h may be disposed on a channel region of the corresponding element region separated by an insulating structure 202h of the semiconductor substrate 200, and a source electrode 212h and a drain electrode 214h disposed on an interlayer insulating film 210 may be respectively connected to a diffusion layer of the corresponding element region of the semiconductor substrate 200 via contact plugs 211h and 213h. The drain electrode 214h may be connected to another diffusion layer of the semiconductor substrate 200, which is a resistor structure, via another contact plug 217h.

As described above, the semiconductor device and the test apparatus and method thereof according to an aspect of the present disclosure may accurately detect a defect occurrence from an external resistor circuit having an output (performance) out of an allowable range compared to the reference, and may also detect a defect occurrence position by comparing outputs (performance) of a plurality of external resistor circuits disposed to be dispersed in an outer region of a semiconductor chip with each other in a test process or by comparing the outputs (performance) of the plurality of the external resistor circuits with a reference output (performance) of an internal resistor circuit or a predetermined reference value.

Accordingly, the semiconductor device and the test apparatus and method thereof according to an aspect of the present disclosure may improve the reliability of the semiconductor chip by accurately detecting defects and defect positions of the semiconductor chip in the test process to prevent quality accidents.

Those skilled in the art to which the present disclosure pertains will understand that the above-described present disclosure may be embodied in other specific forms without changing the technical spirit or essential features thereof.

Therefore, it should be understood that the embodiments described above are illustrative in all respects and not restrictive. The protection scope of the present disclosure should be construed by the claims, and all technological ideas within the equivalent scope thereof should be construed as being included in the scope of rights of the present disclosure.

What is claimed is:

1. A semiconductor device comprising:
   an external resistor circuit disposed to be dispersed along an outer region of a chip, wherein
   the external resistor circuit includes:
      an external resistor structure including at least one of a diffusion layer, a polysilicon layer, and a wiring layer;
      an external transistor connected to the external resistor structure; and
      a first test pad disposed in a chip pad region and connected to the external transistor via the external resistor structure, and the external resistor circuit is configured to output a current of the external transistor to the first test pad based on a change in a resistance value of the external resistor structure.

2. The semiconductor device of claim 1, further comprising
an internal resistor circuit disposed in an inner region of the chip, wherein
the internal resistor circuit includes:
an internal resistor structure disposed in the inner region of the chip and including at least one of a diffusion layer, a polysilicon layer, and a wiring layer;
an internal transistor connected to the internal resistor structure; and
a second test pad disposed in the chip pad region and connected to the internal transistor through the internal resistor structure.

3. The semiconductor device of claim 2, wherein the internal resistor circuit is configured to output a reference signal to be compared with an output of the external resistor circuit.

4. The semiconductor device of claim 2, wherein the internal transistor of the internal resistor circuit includes:
a gate electrode configured to receive a first power signal from an internal circuit of the chip,
a first source or drain electrode configured to receive a second power signal lower than the first power signal from the internal circuit of the chip, and
a second source or drain electrode configured to receive an external power signal supplied to the second test pad through the internal resistor structure.

5. The semiconductor device of claim 1, wherein the external transistor of the external resistor circuit includes:
a gate electrode configured to receive a first power signal from an internal circuit of the chip,
a first source or drain electrode configured to receive a second power signal lower than the first power signal from the internal circuit of the chip, and
a second source or drain electrode configured to receive an external power signal supplied to the first test pad through the external resistor structure.

6. The semiconductor device of claim 1, wherein
the external resistor structure includes the polysilicon layer and the wiring layer,
the polysilicon layer included in the external resistor structure is disposed on an insulating structure of a semiconductor substrate,
the wiring layer included in the external resistor structure includes a plurality of wiring layers each disposed on each of a plurality of interlayer insulating films and connected to each other through a contact plug of each of the interlayer insulating films, and
an uppermost wiring layer among the plurality of wiring layers is exposed to the first test pad.

7. The semiconductor device of claim 6, wherein the plurality of wiring layers included in the external resistor structure are connected to the external transistor, or alternatively via the polysilicon layer, and are disposed to overlap the external transistor and at least a part of the polysilicon layer.

8. The semiconductor device of claim 6, wherein
the external resistor circuit includes a first resistor circuit and a second resistor circuit, and
the first resistor circuit is disposed to partially overlap the second resistor circuit disposed adjacent to the first resistor circuit.

9. The semiconductor device of claim 8, wherein
the semiconductor device comprises another external resistor circuit, and
the plurality of wiring layers included in the external resistor structure are disposed to overlap at least one of an external transistor and a polysilicon layer of said another external resistor circuit.

10. The semiconductor device of claim 6, wherein
the external resistor circuit includes a plurality of resistor circuits, and
the plurality of resistor circuits have the same resistance value and the same external resistor structure, or have the same resistance value but different external resistor structures.

11. A test apparatus of a semiconductor device, comprising:
semiconductor chips each including an external resistor circuit disposed to be dispersed along an outer region of a chip and an internal resistor circuit disposed in an inner region of the chip; and
a test equipment configured to drive the external resistor circuit and the internal resistor circuit, and compare an output of the external resistor circuit with an output of the internal resistor circuit to detect whether a defect has occurred in each of the semiconductor chips.

12. The test apparatus of claim 11, wherein based on a result of the comparison, the test equipment is configured to determine that a defect has occurred in the semiconductor chip and detect a position of the corresponding external resistor circuit as a defect occurrence position.

13. The test apparatus of claim 11, wherein
the external resistor circuit includes:
an external resistor structure including at least one of a diffusion layer, a polysilicon layer, and a wiring layer that are disposed in the outer region of the chip,
an external transistor, and
a first test pad connected to the external transistor through the external resistor structure and disposed in a chip pad region, and
the internal resistor circuit includes:
an internal resistor structure disposed in the inner region of the chip and including at least one of a diffusion layer, a polysilicon layer, and a wiring layer,
an internal transistor, and
a second test pad connected to the internal transistor through the internal resistor structure and disposed in the chip pad region.

14. The test apparatus of claim 13, wherein each of the external transistor of the external resistor circuit and the internal transistor of the internal resistor circuit includes:
a gate electrode configured to receive a first power signal from an internal circuit of the chip,
a first source or drain electrode configured to receive a second power signal lower than the first power signal from the internal circuit of the chip, and
a second source or drain electrode configured to receive an external power signal applied to the corresponding test pad through the corresponding resistor structure.

15. A test apparatus of a semiconductor device, comprising:
semiconductor chips each including a plurality of external resistor circuits disposed to be dispersed along an outer region of a chip; and:
a test equipment configured to drive the plurality of external resistor circuits, and compare outputs of the plurality of external resistor circuits with each other or compare the outputs with a predetermined reference value to detect whether a defect has occurred in each semiconductor chip.

16. The test apparatus of claim 15, wherein based on a result of the comparison, the test equipment is configured to determine that a defect has occurred in the semiconductor chip and detect a position of the external resistor circuit as a defect occurrence position.

17. The test apparatus of claim 15, wherein
each of the plurality of external resistor circuits includes:
- an external resistor structure including at least one of a diffusion layer, a polysilicon layer, and a wiring layer that are disposed in the outer region of the chip,
- an external transistor, and
- a test pad connected to the external transistor through the external resistor structure and disposed in a chip pad region, and the external transistor includes:
- a gate electrode configured to receive a first power signal from an internal circuit of the chip,
- a first source or drain electrode configured to receive a second power signal lower than the first power signal from the internal circuit of the chip, and
- a second source or drain electrode configured to receive an external power signal applied to the test pad through the external resistor structure.

* * * * *